United States Patent
Yamada (10) Patent No.: US 6,522,079 B1
(45) Date of Patent: Feb. 18, 2003

(54) ELECTROLUMINESCENCE DISPLAY DEVICE

(75) Inventor: Tsutomu Yamada, Motosu-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 242 days.

(21) Appl. No.: 09/672,929

(22) Filed: Sep. 28, 2000

(30) Foreign Application Priority Data

Oct. 1, 1999 (JP) ............................................. 11-281793

(51) Int. Cl.[7] ................................................ G09G 3/10
(52) U.S. Cl. ........................ 315/169.3; 313/500; 345/92
(58) Field of Search .......................... 315/169.3, 169.1; 313/500, 498, 499; 345/76, 92

(56) References Cited

U.S. PATENT DOCUMENTS 6,229,506 B1 * 5/2001 Dawson et al. ............... 345/82
6,359,606 B1 * 3/2002 Yudasaka ..................... 313/483

* cited by examiner

Primary Examiner—Don Wong
Assistant Examiner—Tuyet T. Vo
(74) Attorney, Agent, or Firm—Cantor Colburn LLP (57) ABSTRACT

A single shared line (VLc) is provided as a power source line (VL) between two display pixels disposed adjoining each other in a row direction. Such a layout with the shared line (VLc) makes it possible to set the width of the shared line (VLc) equal to the sum of twice the width (Wd) of the power source line and the space (Ws) between the lines, even with the area of a single pixel is the same as in a conventional design. As a result, an increase in line resistance of the power source line can be suppressed, and variation in display luminance in accordance with the distance from a power source terminal due to a voltage drop can be reliably reduced.

10 Claims, 6 Drawing Sheets

ELECTROLUMINESCENCE DISPLAY DEVICE

BACKGROUND OF THE INVENTION

1. Field of the Invention

The present invention relates to an electroluminescence display device comprising an electroluminescence element and a thin film transistor.

2. Description of Prior Art

In recent years, electroluminescence (referred to herein after as "EL") display devices comprising EL elements have gained attention as potential replacements for CRTs and LCDs. Research has been directed to the development of EL display devices using, for example, thin film transistors (referred to hereinafter as "TFT") as switching elements to drive the EL elements.

Figure 1:
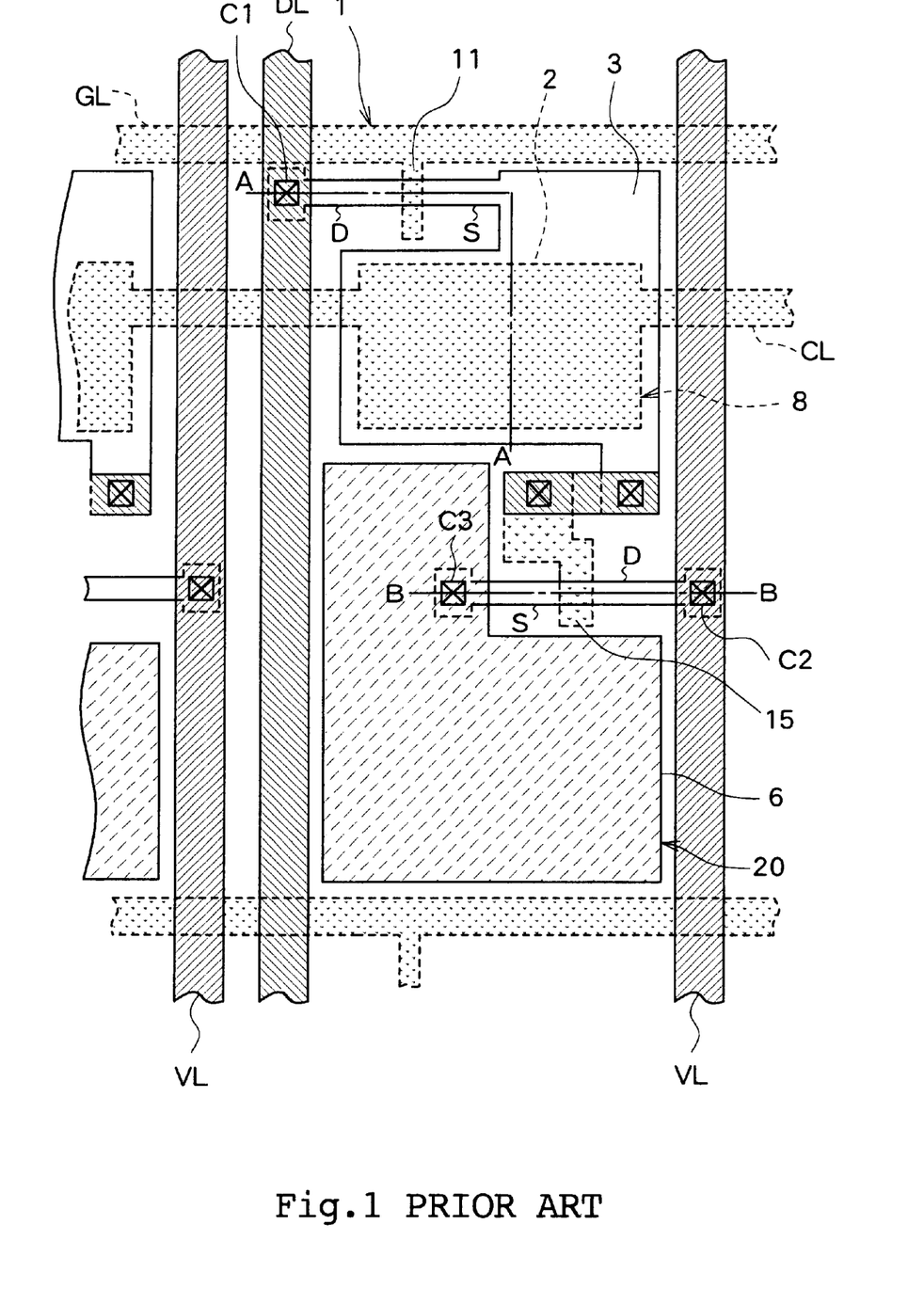
FIG. 1 is a plan view illustrating a display pixel of a conventional EL display device.
Figure 2A:
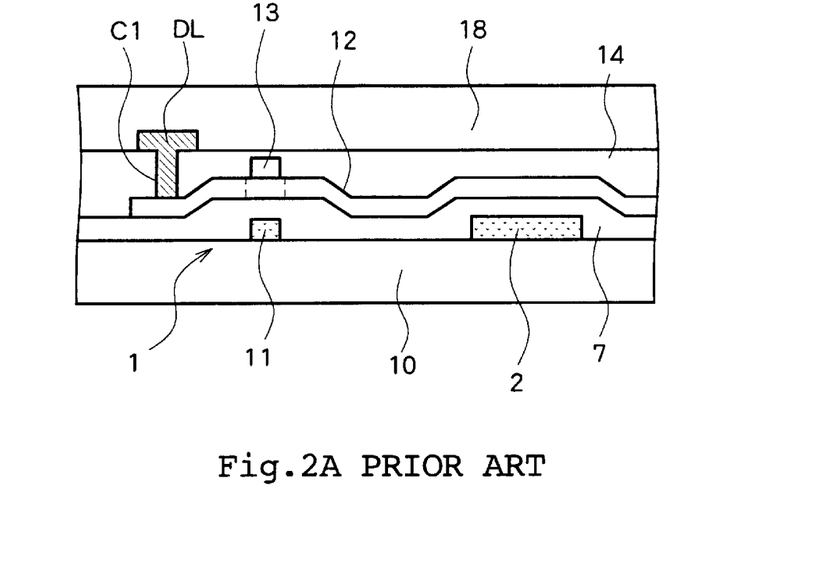
FIG. 2A is a cross sectional view taken along the line A—A in FIG. 1.
Figure 2B:
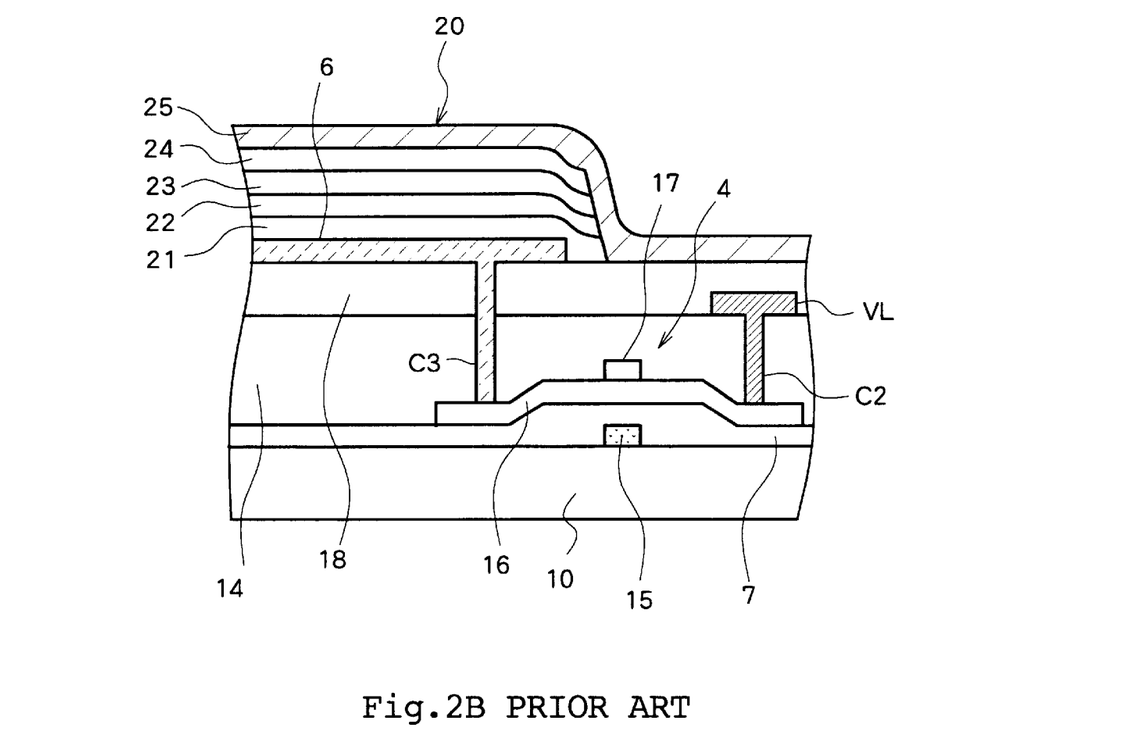
FIG. 2B is a cross sectional view taken along the line B—B in FIG. 1.

FIG. 1 is a plan view showing a display pixel of an organic EL display device. FIG. 2A shows a cross-sectional view taken along line A—A of FIG. 1 while FIG. 2B shows a cross-sectional view taken along line B—B of FIG. 1.

As shown in these drawings, a display pixel 20 is formed in a region surrounded by a gate line GL and a data line DL. A first TFT serving as a switching element is disposed near an intersection of those lines. The source of the TFT 1 simultaneously functions as a second capacitor electrode 3 such that, together with a first capacitor electrode 2, it forms a capacitor 8. The source is connected to a gate electrode 15 of a second TFT 4 that drives the organic EL element. The source of the second TFT 4 contacts with an anode 6 of the organic EL element, while the drain of the TFT 4 is connected to a power source line (drive line) VL.

The first capacitor electrode 2, which is made of a material such as chromium, overlaps, over a gate insulating film 7, the second capacitor electrode 3 integral with the source of the first TFT 1. The first capacitor electrode 2 and the second capacitor electrode 3 together store charges with the gate insulating film 7 being interposed therebetween as a dielectric layer. The storage capacitor 8 serves to retain voltage applied to the gate electrodes 15 of the second TFT 4.

The first TFT 1, the switching TFT, will now be described.

First gate electrodes 11 made of refractory metal such as chromium (Cr) or molybdenum (Mo) are formed on a transparent insulator substrate 10 made of quartz glass, non-alkali glass, or a similar material. As shown in FIG. 1, the first gate electrodes 11 are integrally formed with the gate line GL such that a plurality of these electrodes extend from the gate line GL in the vertical direction in parallel with each other. Referring to FIG. 2A, the first capacitor electrode 2 formed in the same process as that of the first gate electrodes 11 is provided to the right side of the first gate electrodes 11. This first capacitor electrode 2, which constitutes the storage capacitor 8, has an enlarged portion between the first TFT 1 and the second TFT 4 as shown in FIG. 1 and is integral with a storage capacitor line CL extending therefrom in the directions.

A first active layer 12 composed of poly-silicon (referred to hereinafer as "p-Si") film is formed on the gate insulating film 7. The first active layer 12 is of a so-called LDD (Lightly Doped Drain) structure. Specifically, low-concentration regions are formed on both sides of the gate. Source and drain regions, which are high-concentration regions, are further disposed on the outboard sides of the low-concentration regions. On the first active layer 12, a stopper insulating film 13 made of Si oxidation film is formed so as to prevent ions from entering the first active layer 12.

An interlayer insulating film 14 formed by sequential lamination of a $SiO_2$ film, a SiN film, and a $SiO_2$ film is provided on the entire surface over the gate insulating film 7, the active layer 12, and the stopper insulating film 13. The data line DL which functions as a drain electrode is electrically connected, through a contact hole C1 formed in the interlayer insulating film, 14, to the drain in the active layer 12. A planarizing insulating film 18 made, for example, of an insulating organic resin is also formed over the entire surface for planarization.

In EL display devices which are driven by an electric current, the EL layers must have a uniform thickness. Otherwise, current concentration may occur in a portion of the layer having thinner thickness. Thus, a significantly high level of planarity is required at least in portions where the EL elements are to be formed, and therefore the above-described planarizing film 18 made of a material having fluidity prior to hardening is employed.

The second TFT 4 which drives the organic EL element will be described with reference to FIGS. 1 and 2B.

On the insulating substrate 10, second gate electrodes 15 made of the same material as the first gate electrodes 11 are provided, and a second active layer 16 is further formed on the gate insulating film 7. Then, a stopper insulating film 17 is formed on the second active layer 16 in a manner similar to the above-mentioned stopper insulating film 13.

Intrinsic or substantially intrinsic channels are formed in the second active layer 16 above the gate electrodes 15, and source and drain regions are formed on respective sides of these channels by doping p-type impurities, thereby constituting a p-type channel TFT.

The above-described interlayer insulating film 14 is provided on the entire surface over the gate insulating film 7 and the second active layer 16, and the power source line VL is electrically connected, through a contact hole C2 formed in the interlayer insulating film 14, to the drain in the active layer 16. Further, the planarizing film 18 is formed over the entire surface, such that the source is exposed through a contact hole C3 formed in the planarizing film 18 and the interlayer insulating film 14. A transparent electrode made of ITO (Indium Tin Oxide) that contacts the source through this contact hole C3, namely, the anode 6 of the organic EL element 20, is formed on the planarizing insulating film 18.

The organic EL element 20 is formed by laminating, in order, the anode 6, an emissive element layer EM comprising a first hole transport layer 21, a second hole transport layer 22, an emissive layer 23 and an electron transport layer 24, and a cathode 25 made of a magnesium-indium alloy. The cathode 25 is substantially disposed over the entire surface of the organic EL elements.

The principle and operation for light emission of the organic EL element is as follows. Holes injected from the anode 6 and electrons injected from the cathode 25 recombine in the emissive layer 23, to thereby excite organic molecules constituting the emissive layer 23, thereby generating excitons. Through the process in which these excitons undergo radiation until deactivation, light is emitted from the emissive layer. This light radiates outward through the transparent anode via the transparent insulator substrate and resultant light emission is observed.

However, the power source line (drive line) VL shown in FIG. 1 for driving the organic EL element is connected to a power source input terminal (not shown) provided at a position external to the display pixel area, and connected to each of the display pixels arranged in the column direction (vertical direction in the figure). Therefore, as the power source line VL extends farther away from the power source input terminal, its line resistance increases along with the distance from the terminal. As a result, voltage drops along the line, and organic EL elements for display pixels located distant from the power source input terminal do not receive the intended current. This results in a problem that variation in luminance is generated in the display area in the direction where the current is supplied by the power source line VL.

Increasing the width of the power source line VL in order to prevent voltage drop leads to an increase in display pixel size, and, therefore, in the area of the EL display device. On the other hand, in order to increase the width of the power source line VL without changing the overall size of the EL display device, the light emissive area must be reduced, leading to a decrease in display luminance.

SUMMARY OF THE INVENTION

The present invention has been conceived in view of the above-described problems, and provides an EL display device enabling suppression of a decrease in power source current by reducing the resistance of a power source line. A current of the value that should be supplied to an EL element can be provided to all display pixels, thereby achieving a bright and uniform display.

The present invention is characterized in that a data line and a power source line are provided on opposite sides of display pixels arranged in a matrix, and that the display pixels adjoining each other share the power source line.

According to another aspect of the invention, a data line is provided on the side of the display pixel opposite to the side where two display pixels adjoin each other with said shared power source line is provided between said adjoining pixels.

According to a still another aspect of the present invention, an EL display device includes a plurality of display pixels, each comprising an EL element having an emissive layer between an anode and a cathode, a first thin film transistor having a first conductive region (drain or source) of an active layer formed of a semiconductor film connected to a data line, and a gate electrode connected to a gate line, and a second thin film transistor having a third conductive region (drain or source) of an active layer formed of the semiconductor film connected to a power source line for the EL element, a gate electrode electrically connected to a second conductive region (source or drain) of the first thin film transistor, and a fourth conductive region (source or drain) connected to the EL element, wherein the power source line is provided between first and second display pixels disposed adjoining each other.

According to a further aspect of the present invention, the adjoining first and second display pixels in the above EL display device are formed symmetrically about the power source line.

According to a further aspect of the present invention, the width of the power source line in the above EL display device is greater than that of the data line.

As described above, a power source line is disposed between the two adjoining display pixels, and shared by these display pixels to drive both pixels. As a result, in contrast to the case where a power source line is provided for each pixel, a single line can supply current to two pixels. In addition, such a shared line can have a width at least twice that of a conventional power source line. While sufficient space is required between a power source line and a data line for preventing a short circuit and the like when these lines are provided side by side, space can be saved because the data line is provided on the side opposite to the side where the two pixels adjoin, and therefore the shared line can have an increased width.

The power source line extends in the column direction of the matrix, and is connected to each of the display pixels arranged in the column direction for supplying a driving current to, for example, an EL element. Because the power source line over the entire display area is quite long, line resistance is generated. In the present invention, however, a wide line shared by two adjoining display pixels is provided, and connected to thin film transistors and EL elements, so that line resistance is reduced, along with corresponding voltage drop. Consequently, an organic EL element provided for each display pixel can receive a current at the value that should be supplied, achieving a bright and consistent display over the entire display area, and preventing degradation in display and decrease in brightness of the display.

Because a single line is shared by two display pixels, the number of intersections between this line and the gate lines for two pixels is reduced from four in the conventional device to two. As a result, short circuit between layers of the gate line and the shared line (power source line), deterioration in withstand voltage, and the like can all be suppressed.

As described above, the present invention makes it possible to construct an EL display device allowing suppression of an increase in resistance with increased length of the power source line and supplying an electric current at the value that should be supplied to an EL element of each display pixel to prevent variation in luminance.

When the shared line is designed to have a same width Wd as a conventional power source line, reduction in display pixel size and improvement in pixel density can be achieved because one power source line can be eliminated for every two display pixels.

DESCRIPTION OF THE PREFERRED EMBODIMENTS

Figure 3:
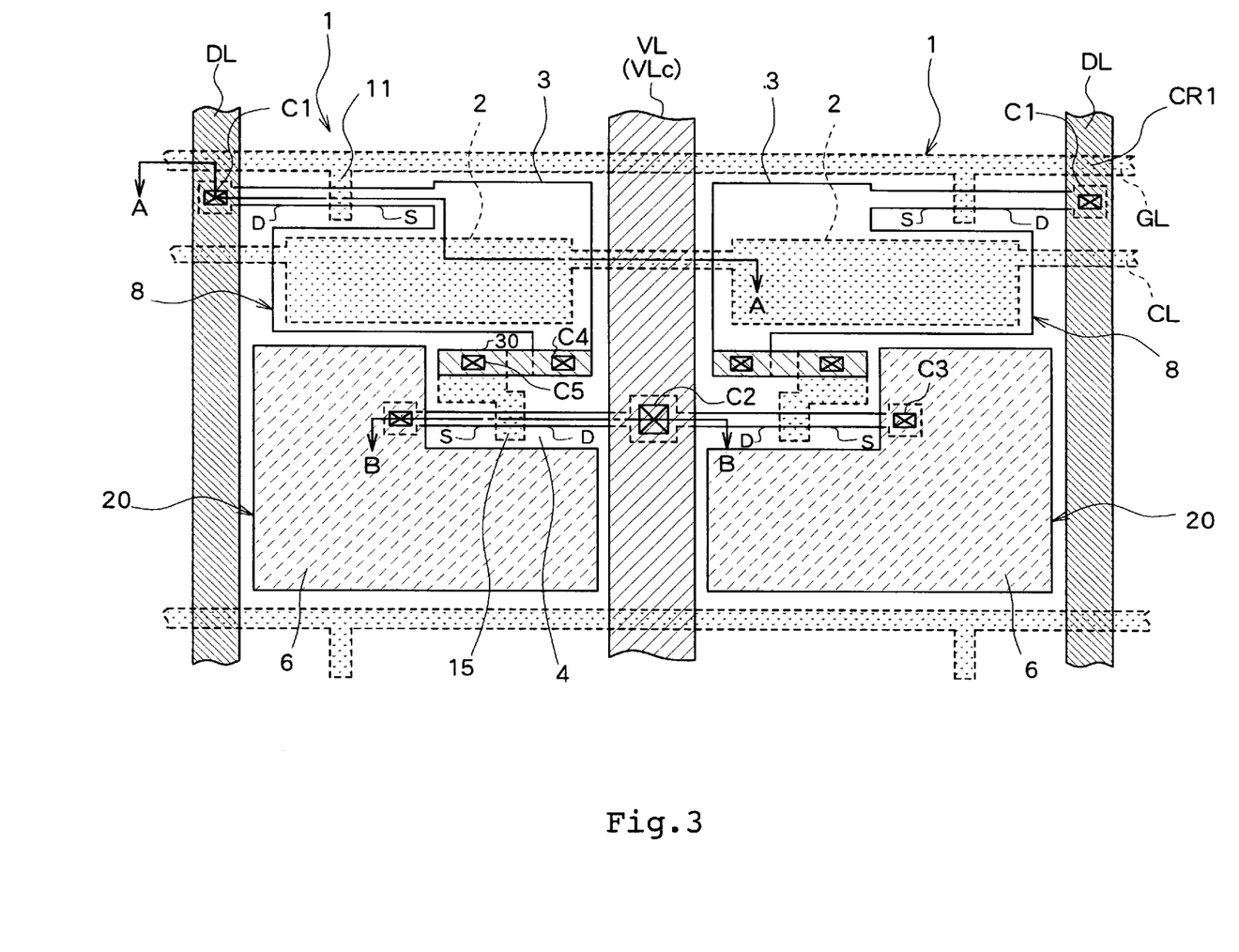
FIG. 3 is a plan view illustrating a display pixel of an EL display device of the present invention.

The EL display device of the present invention will now be described. FIG. 3 illustrates a planar structure of a display pixel of an EL display device. Regions surrounded by dotted lines and shaded are a gate line GL, gate electrodes 11 and 15, a first capacitor electrode 2, and a line CL, formed of a gate material. Regions surrounded by solid lines and without hatching are formed of a P-Si layer, namely, active layers 12 and 16 of TFTs and a second capacitor electrode 3 formed integrally with the active layer 12. A region provided in a lower part of the pixel, surrounded by solid lines and indicated by hatching with dot lines is a transparent electrode serving as an anode 6 of an EL element 20. Regions surrounded by solid lines and indicated by hatching are lines VL, DL, and 30, containing Al as a main component.

Figure 4A:
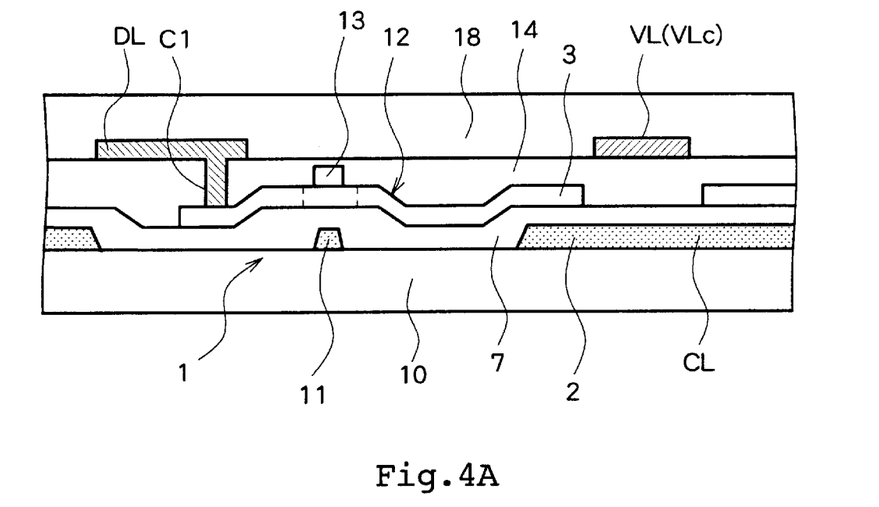
FIG. 4A is a cross sectional view taken along the line A—A in FIG. 3.
Figure 4B:
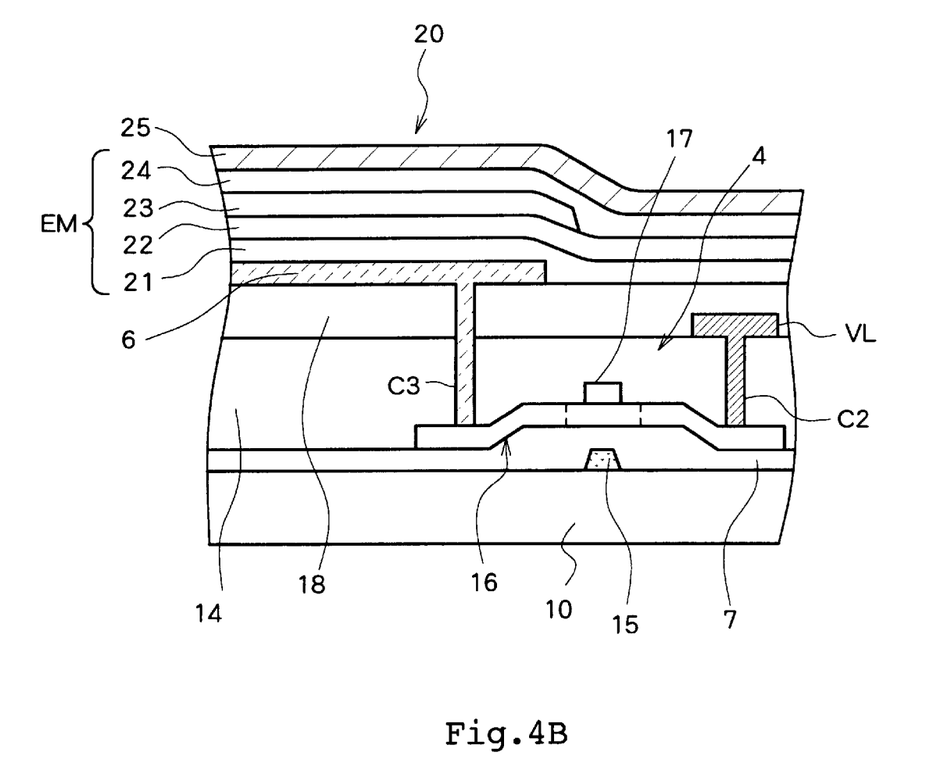
FIG. 4B is a cross sectional view taken along the line B—B in FIG. 3.

FIGS. 4A and 4B are cross sectional views taken along the lines A—A and B—B in FIG. 3, respectively. A display area is composed of a plurality of display pixels shown in FIG. 3 arranged in a matrix.

In the present embodiment, first and second TFTs 1 and 4 are both of the bottom gate type, and a p-Si film is used for the active layers 12 and 16. The gate electrodes 11 and 15 are of the single gate structure.

FIG. 3 shows two display pixels surrounded by the gate line GL, the data line DL, and the power source line (drive line) VL. The power source line VL is formed between the two pixels and shared by them. The display pixels adjoining each other in a row direction are formed symmetrically about the shared line. In the following, only the left one of the symmetrical two pixels is explained, and description of the right pixel will not be repeated.

An organic EL display device according to the present embodiment will be specifically described with reference to FIG. 3, and FIGS. 4A and 4B.

First, a transparent substrate 10 having an insulation capability at least at the surface is provided. In the present embodiment, a metal cap (can) is provided, though unillustrated in the drawings, to seal the EL material and protect the EL element from moisture. Consequently, the emitted light is obtained from the substrate 10, and therefore the substrate 10 must be transparent, because the metal cap is opacity. However, when a transparent cap is provided so that the emitted light is obtained from this cap, the substrate 10 need not be transparent. In this example, the transparent substrate 10 formed of glass, synthetic resin, or the like, is employed.

On a main surface of the transparent substrate 10, a gate line GL extends horizontally (in a row direction) along an upper side of each pixel region shown in FIG. 3, and the gate electrodes 11 extend from the gate line GL for each pixel. A first capacitor electrode 2 serving as a lower electrode of a storage capacitor 8 is formed at the same time and of the same material as the gate. The first capacitor electrodes 2 located adjacent to each other in the row direction are connected by the capacitor line CL formed integrally with the electrodes 2. As the lines GL and CL are in the same layer formed simultaneously of the same material, as described above, they are indicated by the same hatching in FIG. 3. This layer is formed of a refractory metal, such as Cr or Ta, because the layers (12, 16, and 3) provided over this layer are formed of P-Si through an annealing process. In this embodiment, a Cr layer of about 1000–2000 Å is formed through sputtering. Taking step coverage into consideration, edges of these lines are tapered during patterning.

After forming the gate and the electrode located at the same layer, a gate insulating film 7 and a semiconductor film forming active layers of the TFTs 1 and 4 are successively formed in this order through plasma CVD over the entire substrate. As the gate insulating film 7, a Si nitride film of about 500 Å and a Si oxide film of about 1300 Å are successively formed in this order from the bottom, and then an a-Si film of about 500 Å is formed. The semiconductor film first formed as described above an a-Si film is then turned into a p-Si film through an annealing process as described hereinafter, and used for the active layers 12 and 16 and a second capacitor electrode 3 which is an upper electrode of the storage capacitor 8.

The a-Si film is subjected to dehydrogenation annealing in a nitrogen atmosphere at a temperature of about 400° C., and turned into a p-Si film through polycrystallization with an excimer laser. The numerals 13 and 17 indicate stopper insulating films formed of an Si oxide film, serving as a mask during ion implantation into the active layers 12 and 16. The first TFT 1 is formed as an N-channel TFT by doping P (phosphorous) ions to form the source and the drain using the first stopper insulating film 13 as a mask. The second TFT 4 is formed as a P-channel TFT by doping B (boron) ions into the source and the drain using the second stopper insulating film 17 as a mask.

The P-Si layer is patterned to a desired shape as shown in FIG. 3 through photolithography. The P-Si layer constituting the active layer of the first TFT 1 overlaps a data line DL in the vicinity of an upper-left intersection of the gate line GL and the data line DL, and bestrides the gate electrode 11. The second capacitor electrode 3 formed integrally with this active layer also extends overlapping the first capacitor electrode 2. The second capacitor electrode 3 is connected to the gate electrode 15 of the second TFT 4 through the connection line 30 extending to the right side, as viewed in FIG. 3, of the gate electrode 15 and formed over the gate electrode 15 in a later step. The P-Si layer constituting the active layer 16 of the second TFT 4 is patterned so as to extend under the power source line VL disposed between two pixels, over the second gate electrode 15, and then under the anode 6 formed of the transparent electrode.

An interlayer insulating film 14 is formed over the entire surface. This interlayer insulating film 14 is of a three-layer structure including an Si oxide film of about 1000 Å, an Si nitride film of about 3000 Å, and an Si oxide film of 1000 Å, stacked in this order from the bottom through sequential CVD. It should be noted, however, that this interlayer insulating film is only required to have at least a single layer and that the thickness of the films are not limited to the above examples.

On the interlayer insulating film 14 are formed the data line DL and the shared line (power source line VL) extending in a column direction of the display pixels arranged in a matrix, as shown in FIG. 3. At the same time, the connection line 30 for connecting the second capacitor electrode 3 and the gate electrode 15 of the second TFT 4 is formed. A contact hole is formed at a predetermined position of the interlayer insulating film 14, and respective semiconductor layers are exposed at the bottom of a contact hole C1 for the data line DL and the active layer of the first TFT 1, a contact hole C2 for the power source line VL and the active layer of the second TFT 4, and a contact hole C4 for the connection line 30 and the capacitor electrode 3. In contrast to these contact holes, at a contact hole C5 for the connection line 30 and the second gate electrode 15, a Cr film used for the gate electrode 15 is exposed because, not only the interlayer insulating film 14, but also the gate insulating film 7 are provided between these layers and the gate insulating film 7 is also etched. In the contact holes C1, C2, C4, and C5, respective line materials are filled, including a lower Mo layer of 1000 Å, and an upper Al layer of 7000 Å, wherein the Mo layer serves as a barrier layer.

On these lines and the interlayer insulating film 14, a planarized film 18 of an insulating material having a thickness of about 1–3 µm is formed over the entire surface. The planarized film 18 is included because of the emissive element film EM of the organic EL element. This film EM includes a first hole transport layer 21, a second hole transport layer 22, an emissive layer 23, and an electron transport layer 24. The hole transport layers may be formed of a single layer. Because such an organic EL element is composed of stacked thin films and driven by an electric current, respective thin films must be formed with a highly, uniform thickness. Otherwise, variations in thickness lead to a larger amount of current flowing through portions with a smaller thickness, thereby creating points emitting much brighter light than the rest of the display. The organic film is likely to undergo accelerated deterioration at these points, leading to, in the worst case, breakdown. In order to prevent such breakdown, it is necessary to make the entire surface including the anode 6 as flat as possible. In this example, as a liquid acrylic resin is applied which has fluidity, a flat upper surface can be obtained before being cured, and naturally the surface remains flat after being cured. The material of the planarized film 18 is not limited to the acrylic resin.

In the present embodiment, the anode 6 and the source of the second TFT 4 must be connected, and therefore a contact hole C3 is formed through the planarized film 18 and the interlayer insulating film 14. Through this contact hole C3, the second active layer 16 is connected to the transparent electrode forming the anode 6 of an organic EL element 20.

The anode 6 is patterned, for example, as shown in FIG. 3, and an organic film forming the EL element is formed in a region covering at least the anode 6. More specifically, on the anode 6, the organic film includes the emissive layer EM composed of the first hole transport layer 21 formed of MTDATA: 4,4',4"-tris(3-methylphenylphenylamino) triphenylamine, the second hole transport layer 22 of TPD: N,N'-diphenyl-N,N'-di(3-methylphenyl)-1,1'-biphenyl-4,4'-diamine, the emissive layer 23 of Bebq$_2$: bis(10-hydroxybenzo[h]quinolinato)beryllium including quinacridone derivatives, and the electron transport layer 24 of Bebq$_2$, and a cathode 25 formed of a magnesium-silver (Ag) alloy, an Al-Li alloy, Al/LiF, or the like, stacked from the bottom. The cathode 25 is composed of stacked layers of Al and LiF. (It is substantially formed of an alloy of these materials because an LiF layer is extremely thin.)

While the anode 6 must be patterned for each pixel, the types of films provided on the anode 6 are classified in accordance with the structure as follows:
1) a structure wherein the layers from the anode 6 to the cathode 25 are patterned for each pixel;
2) a structure wherein among the the layers from the anode 6 to the cathode 25, only the cathode 25 is not patterned and formed over substantially the entire display area; and
3) a structure wherein only the anode 6 is patterned for each pixel as shown in FIG. 3, and the layers from the layer immediately on top of the anode to the cathode are formed over the entire display area.

As it is not particularly necessary to pattern the cathode 25, it is generally formed over the entire area. Another planarized film may further be formed on the planarized film 18 to cover the edge of the anode 6.

A metal cap is bonded onto the main surface of the substrate 10 for separating, from the external environment, at least an EL layer of the display area, and preferably the entire region on the substrate 10 where the EL layer is provided. The purpose of such a provision is to seal the display area with the cap so as to prevent any moisture from entering the sealed area because the EL layer is degraded by absorbing moisture. The cap may, therefore, be replaced with a film highly resistant to moisture, such as a resin film, or a metal cap may be provided on such a film.

The light emitting principles and operations of the organic EL element will be described. Holes and electrons injected from the anode 6 and the cathode 25, respectively, are recombined in the emissive element layer EM, thereby exciting organic molecules contained in the emissive layer 23 and generating excitons. Light is released from the emissive layer 23 during the process in which the excitons deactivate, and this release of light to the outside from the transparent anode 6 through the transparent insulating substrate 10 is explained.

The present invention is characterized in the shared line (power source line VL) structure. This line is shared by two adjoining display pixels as the power source line VL, and provides an advantage that the width of this shared line can be increased without decreasing the light emissive area.

Figure 5A:
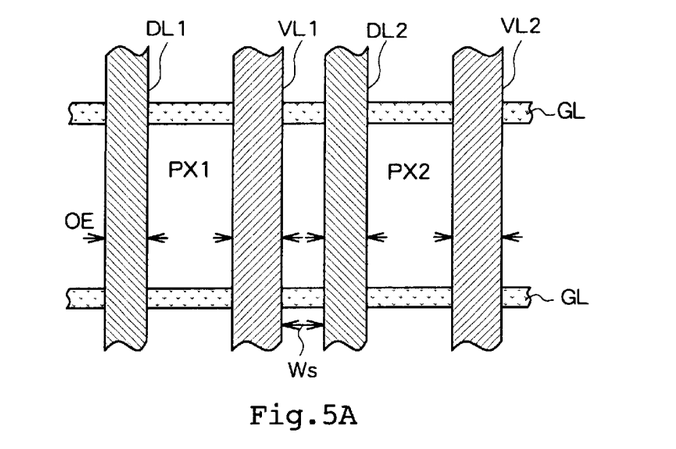
FIGS. 5A, 5B, and 5C are views for describing the importance of the layout of the EL display device of the present invention.
Figure 5B:
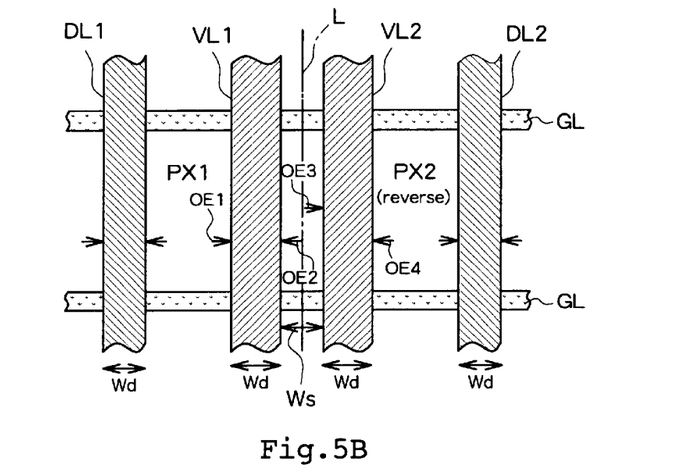
Figure 5C:
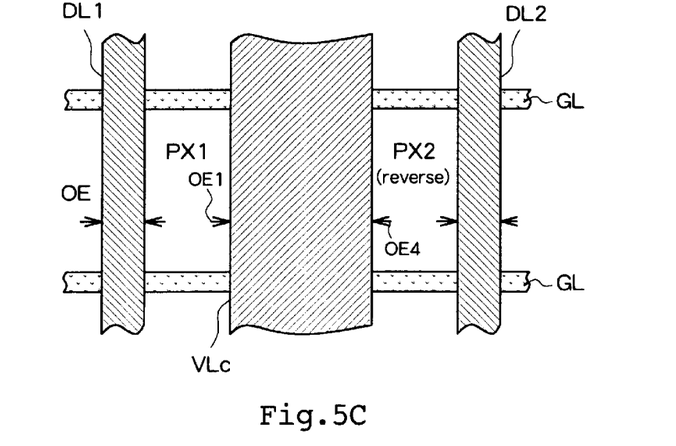

The root of this advantage will be described with reference to FIGS. 5A–5C. FIG. 5A illustrates a conventional structure of display pixels, and FIG. 5C illustrates a structure of display pixels of the present invention. FIG. 5B is a view used for describing a structure where two adjoining pixels are symmetrical about a line L.

Two display pixels surrounded by the data line DL, the power source line VL, and the gate line GL are located adjoining each other and labeled as PX1 and PX2.

In FIG. 5A, the data line DL and the power source line VL are disposed sandwiching a display pixel PX so that a power source line VL1 for supplying an electric current to the display pixel PX1 and a data line DL2 for supplying data signals to the display pixel PX2 are provided side by side extending in the column direction. Consequently, a space Ws is provided between the power source line VL1 and the data line DL2 for preventing these two lines from short circuiting.

FIG. 5B illustrates a layout of the pixels symmetrical about the central line L. In such a layout, the display pixel PX2 is horizontally reversed, and the power source lines VL1 and VL2 for the display pixels PX1 and PX2, respectively, are provided adjoining each other. While the adjoining pixels cannot be connected to a single data line DL because different data signals are supplied to different pixels, they can theoretically be connected to a single power source line VL because each power source line VL is connected to a power source input terminal to apply the same voltage throughout the display area.

Therefore, in this embodiment, the power source lines VL1 and VL2 disposed adjoining each other in FIG. 5B are integrated as shown in FIG. 5C, and the integrated line serves as a line VLc shared by the display pixels adjoining in the row direction.

As can be seen from FIG. 5C, when an area for one display pixel PX remains unchanged, the width of the shared line VLc can be set as the sum of the width Wd of the power source line VL1, the width Wd of the power source line VL2, and the space Ws (2Wd+Ws).

The data line DL and the power source line VL both contain Al as a main component, and formed simultaneously as the same layer. For patterning an Al layer to a desired shape, an overetching step is required. The overetching width is indicated by a small arrow OE in FIGS. 5A–5C. The power source line VL1 and the data line DL2 in FIG. 5A, and the power source lines VL1 and VL2 in FIG. 5B are patterned as individual lines, and therefore the line layout must be designed taking the overetching widths OE1–OE4 into consideration. On the other hand, in FIG. 5C, the overetching widths OE2 and OE3 in FIG. 5B do not exist because the two power source lines VL1 and VL2 are integrated into the single shared line VLc.

As the widths Wd of the data line DL and the power source line VL are set substantially the same in actual EL display devices, the width of the shared line VLc can be set as the sum of 2Wd and the space Ws (including OE2 and OE3), as described above.

Thus, it is possible to provide the shared line VLc with a width greater than twice the width Wd of the power source line VL. It should be noted that, while a current twice that in a conventional line naturally flows in the shared line VLc to drive two display pixels on the right and left sides thereof, the line resistance of the shared line can be reduced from that of the line in FIG. 5A, for example, because the line VLc can be twice as wide, or wider, than a conventional line. Consequently, a voltage drop due to line resistance can be reduced much more than with a conventional device.

Assuming that the space Ws is equal to the width Wd of the power source line VL in FIG. 5B, the width of the shared line VLc becomes 3Wd. When the space Ws is an ideal value, the actual distance between the lines VL1 and VL2 in FIG. 5B, for example, will be the sum of the space Ws and the overetching widths OE2 and OE3. In either case, the width of the shared line VLc will be 3Wd or greater when Ws≈Wd, and therefore the voltage drop can be reduced to half or lower of that in the power source line VL with the width Wd.

In the present invention, the width of the power source line VLc is not limited to a "3Wd or greater". More specifically, the width is not necessarily determined based on the premise that the widths Wd of the lines VL and DL shown in FIG. 5B are equal and that the space Ws between the lines VL1 and VL2 is substantially equal to the width Wd. The width of the line VLc can be determined in accordance with requirements of the power source line VLc, such as the line resistance or the like. Further, the width Wd of the data line DL may not be equal to that of the power source line VL or the space Ws as in FIG. 5B.

The power source line VL extends in the column direction in the display area, and is connected to each of the display pixels arranged in the column direction to supply a driving current to the EL element. Although the power source line VL is quite long over the entire display area and line resistance is generated, the width of the power source line VLc can be increased by utilizing the above-described layout where the line VLc is provided between, and shared by, two display pixels adjoining each other in the row direction. As a result, a voltage drop due to line resistance can be reduced compared to that in a conventional layout, so that the current at the value that should be supplied can be sufficiently provided from the shared power source line VL to the organic EL element disposed for each display pixel, thereby allowing prevention of decrease in luminance of emitted light and variation in display due to line resistance.

Because two display pixels share a single power source line VLc, the number of intersections between the gate line GL and the lines DL and VL for two pixels can be reduced from conventional four, to two. Consequently, the probability of short circuiting between layers of the gate line GL and the shared line VLc (power source line VL), of causing deterioration in withstand voltage, and the like can be suppressed to an extremely low value.

While a layout including TFTs of a bottom gate type is described above, the present invention can also be applied to a layout employing top gate TFTs, as will be described below in a second preferred embodiment of the present invention.

The planar pattern of the TFTs of the top gate type is substantially the same as that of the TFTs of the bottom gate type shown in FIG. 3 and FIG. 5. The cross sections corresponding to the lines A—A and B—B in FIG. 3 are shown in FIG. 8A and FIG. 8B, respectively. The portions in FIGS. 8A and 8B identical to those in the drawings referred to in the above description are labeled with identical numerals and characters.

An insulating layer 180 is first formed over the entire surface of the substrate 10. This insulating layer 180 is composed of a lower Si nitride film of 500 Å, and an upper Si oxide film of 1000 Å. The Si nitride film serves as a stopper for impurities dispersed from glass.

Semiconductor layers (p-Si or a-Si layers) are formed at regions where the active layer 12 of the first TFT 1, a lower electrode (second electrode 103) of the storage capacitor 8 integrally formed with the active layer 12, and the second active layer 16 of the second TFT 4 are formed.

A gate insulating film 107 is disposed over the entire surface covering these semiconductor layers, and, in the first TFT 1, a gate electrode 111 and the gate line GL integral with the gate electrode 111 are formed on the film 107 as shown in FIG. 8A. Simultaneously, an upper electrode (first electrode 102) of the storage capacitor 8 is formed of the same material in the same layer as the gate electrode 111. The first electrode 102 corresponding to the first capacitor electrode 2 shown in FIG. 3 is formed integrally with the storage capacitor line CL, and extends in the row direction. In the second TFT 4, a gate electrode 115 shown in FIG. 8B is formed at the same time and of the same material as the gate electrode 111 of the first TFT 1. For these gate electrodes, a material containing Al as the main component in addition to a refractory metal mentioned above may be employed. The reason why Al can be used is that the interlayer insulating film 14 can be formed at a low temperature through plasma CVD or the like.

The semiconductor layers serving as the active layers 12 and 16 are doped with impurities using as a mask the gate electrodes 111 and 115 patterned in a predetermined shape, so that a channel region is formed immediately under the gate, and source and drain regions are formed on both sides thereof. As a P-channel TFT and an N-channel TFT are to be formed, in doping one TFT with impurities of the conductive type of either P or N, the other TFT region is masked with resist, which also applies to the bottom gate type structure. After the doping of impurities, the semiconductor layers are patterned, and the gate insulating film 107 is then formed. The semiconductor layer constituting the lower electrode 103 of the storage capacitor 8 is not doped with impurities because the upper electrode 102 formed of the same material as the gate lies over this semiconductor layer. However, this layer is used as an electrode by applying a voltage equal to or higher than that provided to the first gate electrode 111, and generating a channel at the semiconductor layer.

Figure 6A:
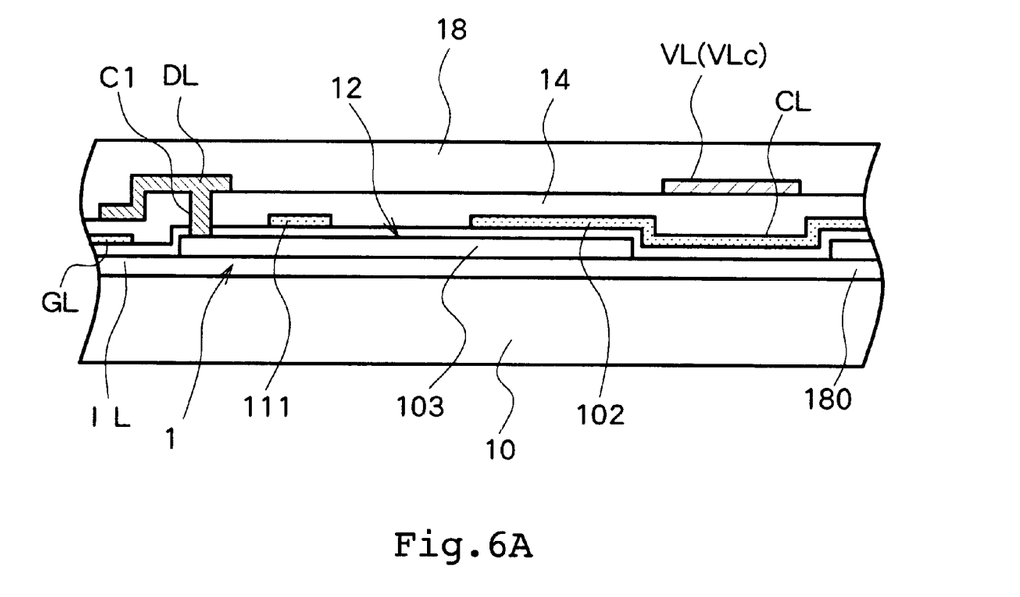
FIG. 6A is a cross sectional view of the EL display device with a top gate type TFT taken along the line A—A in FIG. 3.
Figure 6B:
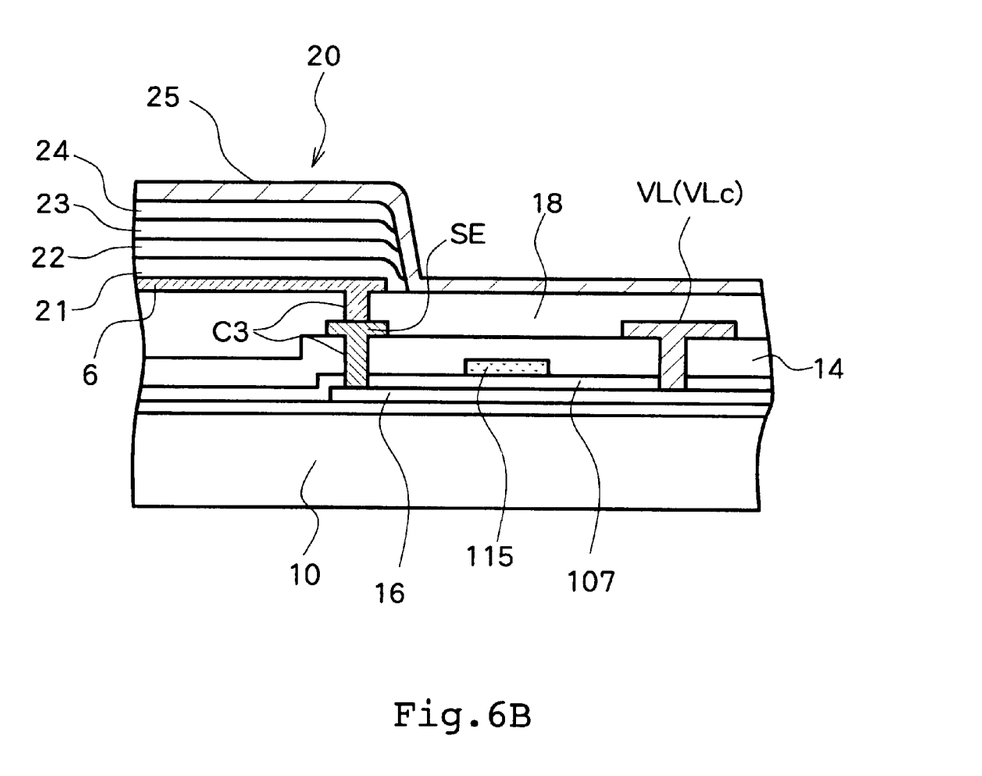
FIG. 6B is a cross sectional view of the EL display device with a top gate type TFT taken along the line B—B in FIG. 3.

The interlayer insulating film 14 is formed after the doping process, followed by formation of the data line DL, the shared line VLc (power source line VL), and the planarized film 18. As shown in FIG. 6B, a transparent electrode is then formed as the anode 6. This anode 6 and the second TFT 4 are connected through the source electrode SE, formed in the same layer as the shared line VLc (power source line VL), in the contact hole C, or may be directly connected as shown in FIG. 4B.

The EL element 20 has the same structure as that described above in connection with the first embodiment.

While a p-Si film is described as an example semiconductor film in the embodiments, the present invention can also be applied to semiconductor films such as a microcrystalline silicon film, an amorphous silicon film, or the like. Further, while the first and second TFTs are of the single gate type in the above description, either one, or both, of the TFTs may be of the double gate type.

Although the above embodiments are described in the context of an organic EL display device, the present invention is not limited to such a device and will provide similar effects when applied to an inorganic EL display device having an emissive layer made of an inorganic material.

What is claimed is:

1. An electroluminescence display device including a plurality of display pixels arranged in a matrix, each display pixel comprising an EL element and a thin film transistor for driving said EL element, wherein a data line and a power source line for driving said thin film transistor are provided on opposite sides of each display pixel, and display pixels disposed adjoining each other share said power source line.

2. An electroluminescence display device according to claim 1, wherein the width of said power source line is greater than that of said data line.

3. An electroluminescence display device according to claim 1, wherein said data line is provided on the side of the display pixel opposite the side where two display pixels adjoin each other, and said shared power source line is provided between said adjoining pixels.

4. An electroluminescence display device according to claim 3, wherein the width of said power source line is greater than that of said data line.

5. An electroluminescence display device according to claim 1, wherein said two adjoining display pixels are disposed symmetrically about said power source line provided therebetween.

6. An electroluminescence display device including a plurality of display pixels, each comprising:

an EL element having an emissive layer between an anode and a cathode;

a first thin film transistor having a first conductive region of an active layer formed of a semiconductor film connected to a data line, and a gate electrode connected to a gate line; and a second thin film transistor having a third conductive region of an active layer formed of said semiconductor film connected to a power source line for said EL element, a gate electrode electrically connected to a second conductive region of said first thin film transistor, and a fourth conductive region connected to said EL element; wherein said power source line is provided between first and second display pixels disposed adjoining each other.

7. An electroluminescence display device according to claim 6, wherein said first and second display pixels are formed symmetrically about said power source line.

8. An electroluminescence display device according to claim 7, wherein the width of said power source line is greater than that of said data line.

9. An electroluminescence display device according to claim 6, wherein the width of said power source line is greater than that of said data line.

10. An electroluminescence display device according to claim 6, wherein said first and second display pixel share said power source line provided between said first and second display pixel.

* * * * *